United States Patent
Wang

(10) Patent No.: US 7,341,913 B2
(45) Date of Patent: Mar. 11, 2008

(54) METHOD OF MANUFACTURING NON-VOLATILE MEMORY

(75) Inventor: Zi-Song Wang, Taoyuan County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 111 days.

(21) Appl. No.: 11/308,183

(22) Filed: Mar. 10, 2006

(65) Prior Publication Data

US 2007/0148861 A1 Jun. 28, 2007

(30) Foreign Application Priority Data

Dec. 26, 2005 (TW) .............................. 94146474 A

(51) Int. Cl.
*H01L 21/336* (2006.01)
(52) U.S. Cl. .................. 438/257; 438/295; 257/E21.68
(58) Field of Classification Search ........ 438/257–267, 438/295; 257/314–320, E21.68
See application file for complete search history.

(56) References Cited

U.S. PATENT DOCUMENTS

2004/0115882 A1 * 6/2004 Hung et al. .................. 438/257
2005/0139900 A1 * 6/2005 Jung et al. .................. 257/319

* cited by examiner

*Primary Examiner*—Brook Kebede
*Assistant Examiner*—Jae Lee
(74) *Attorney, Agent, or Firm*—Jianq Chyun IP Office

(57) ABSTRACT

The invention is directed to a method for manufacturing a non-volatile memory. The method comprises steps of forming a mask layer on a substrate. An isolation structure is formed in the mask layer and the substrate, wherein the top surface of the isolation structure is lower than that of the mask layer and the isolation structure and the mask layer together form a recession. A spacer is formed at the sidewall of the recession and the recession is filled with an insulating layer. The mask layer and the spacer are removed and a tunneling dielectric layer is formed over the substrate. A first conductive layer is formed to fill the first opening and the isolating layer is removed to form a second opening. A gate dielectric layer and a second conductive layer are formed over the substrate sequentially. The second conductive layer and the first conductive layer are patterned.

20 Claims, 3 Drawing Sheets

METHOD OF MANUFACTURING NON-VOLATILE MEMORY

CROSS-REFERENCE TO RELATED APPLICATION

This application claims the priority benefit of Taiwan application serial no. 94146474, filed on Dec. 26, 2005. All disclosure of the Taiwan application is incorporated herein by reference.

BACKGROUND OF THE INVENTION

1. Field of Invention

The present invention relates to a method for manufacturing a memory. More particularly, the present invention relates to a method for manufacturing a non-volatile memory.

2. Description of Related Art

Non-volatile memory can be used to perform storage operation, read operation and erasing operation for several times. The non-volatile memory possesses the ability that the stored data still remained in the memory even after the power is off. Furthermore, the non-volatile memory also has the properties such as high access rate, light in weight but large in memory capacity and small equipment volume. Therefore, the non-volatile memory becomes the most widely used memory device in the personal computers and the electronic equipments.

The floating gate and the control gate of the common non-volatile memory are made of doped polysilicon. FIGS. 1A through 1C are cross-sectional views showing a conventional method for forming a non-volatile memory. As shown in FIG. 1A, isolation structures 110 are formed in a substrate 100. A tunneling dielectric layer 120, a doped polysilicon layer 130 and a mask layer 135 are formed over the substrate 100 sequentially. The mask layer 135 is used to pattern the underlay doped polysilicon layer 130.

As shown in FIG. 1B, a patterned photoresist layer (not shown) is formed on the mask layer 135. By using the patterned photoresist layer as a mask, the pattern of the patterned photoresist layer is transferred onto the mask layer 135. Then, by using the patterned mask layer 135 as a mask, the doped polysilicon layer 130 is etched.

As shown in FIG. 1B together with FIG. 1C, the patterned mask layer 135 is removed. A gate dielectric layer 140 is formed over the substrate 100. Thereafter, another doped polysilicon layer 150 is formed on the gate dielectric layer 140. Then, the doped polysilicon layer 150 and the doped polysilicon layer 130 are defined to be a control gate (doped polysilicon layer 150) and a floating gate (doped polysilicon layer 130).

In the aforementioned method for forming the non-volatile memory, a doped polysilicon layer 130 is formed over the substrate 100 first and then a photo lithography process is performed to pattern the doped polysilicon layer 130. The cost of the aforementioned photo lithography process is high and it is not easy to control the photo lithography process. That is, the misalignment issue easily happens.

As the process of the integrated circuit is below 90 nm, the line width of the device is smaller and smaller. On the other words, the width of the isolation structure 110 is narrower. Under the circumstance mentioned above, the process window of the photo lithography process is decreased so that the tolerance range for the misalignment is decreased as well. If the substrate 100 is exposed during the etching process, the abnormal conduction between the devices will happen. Therefore, the yield of the device is affected.

Moreover, with the decreasing of the line width of the device, the gate electrode coupling between the floating gate and the control gate is decreased. Accordingly, the operating voltage of the non-volatile memory is inevitably increased. Hence, it is disadvantage to apply the non-volatile memory onto the portable electronic product having highly demands on low power consumption. Therefore, how to improve the process window of the non-volatile memory, to prevent the memory from being abnormally connected and to manufacture a memory having high gate electrode coupling becomes a very important task.

SUMMARY OF THE INVENTION

Accordingly, at least one objective of the present invention is to provide a method for forming non-volatile memory and a floating gate layer capable of simplifying the manufacturing process and increasing the process window so as to form the memory with relatively high gate electrode coupling and to decrease the operating voltage of the memory.

To achieve these and other advantages and in accordance with the purpose of the invention, as embodied and broadly described herein, the invention provides a method for manufacturing a non-volatile memory. The method comprises steps of providing a substrate and then forming a mask layer on the substrate. An isolation structure is formed in the mask layer and the substrate, and a portion of the isolation structure is removed so that the top surface of the isolation structure is lower than the top surface of the mask layer, wherein the remaining isolation structure and the mask layer together form a recession. A spacer is formed at the sidewall of the recession and the recession is filled with an insulating layer. The mask layer and the spacer are removed to form a first opening exposing a portion of the substrate and a tunneling dielectric layer is formed over the substrate. A first conductive layer is formed to fill the first opening and the isolating layer is removed to form a second opening in the first conductive layer. A gate dielectric layer is formed over the substrate and a second conductive layer is formed on the gate dielectric layer. The second conductive layer and the first conductive layer are patterned.

In the method according to one embodiment of the present invention, the method for forming the first conductive layer to fill the first opening comprises steps of forming a first conductive material layer and planarizing the first conductive material layer by using the isolating layer as a stop layer.

In the method according to one embodiment of the present invention, the step of planarizing the first conductive material layer further comprises a step of removing a portion of the isolating layer.

In the method according to one embodiment of the present invention, the method of planarizing the first conductive material layer comprises a chemical mechanical polishing.

In the method according to one embodiment of the present invention, the method for removing the mask layer and the spacer comprises a dry etching process and a wet etching process.

In the method according to one embodiment of the present invention, the method of forming the isolation structure comprises steps of patterning the mask layer, forming a trench in the substrate by using the mask layer as a mask and filling up the trench with an isolation material so as to form the isolation structure.

In the method according to one embodiment of the present invention, the method for forming a spacer comprises steps of forming a spacer material layer over the mask layer and etching back the spacer material layer to form the spacer at the sidewall of the mask layer.

In the method according to one embodiment of the present invention, before the mask layer is formed, the method further comprises a step of forming a pad layer.

In the method according to one embodiment of the present invention, the gate dielectric layer can be a silicon oxide/silicon nitride/silicon oxide layer.

In the method according to one embodiment of the present invention, the first conductive layer is made of doped polysilicon.

In the method according to one embodiment of the present invention, the second conductive layer is made of doped polysilicon.

The present invention also provides a method for forming a floating gate layer. The method comprises steps of providing a substrate and then forming a mask layer on the substrate and then forming an isolation structure in the mask layer and the substrate. A portion of the isolation structure is removed so that the top surface of the isolation structure is lower than the top surface of the mask layer and a recession is formed in the mask layer to expose the sidewall of the mask layer. A spacer is formed on the sidewall of the mask layer and the recession is filled with an isolating layer. The mask layer and the spacer are removed to form an opening exposing the substrate and a tunneling dielectric layer is formed over the substrate. A conductive layer is formed over the substrate to fill the opening.

In the method according to one embodiment of the present invention, the method for forming the conductive layer to fill the opening comprises steps of forming a conductive material layer and planarizing the conductive material layer by using the isolating layer as a stop layer.

In the method according to one embodiment of the present invention, the step of planarizing the conductive material layer further comprises a step of removing a portion of the isolating layer.

In the method according to one embodiment of the present invention, the method of planarizing the conductive material layer comprises a chemical mechanical polishing.

In the method according to one embodiment of the present invention, the method for removing the mask layer and the spacer comprises a dry etching process and a wet etching process.

In the method according to one embodiment of the present invention, the method of forming the isolation structure comprises steps of patterning the mask layer, forming a trench in the substrate by using the mask layer as a mask and then filling up the trench with an isolation material so as to form the isolation structure.

In the method according to one embodiment of the present invention, the method for forming a spacer comprises steps of forming a spacer material layer over the mask layer and etching back the spacer material layer to form the spacer at the sidewall of the mask layer.

In the method according to one embodiment of the present invention, the spacer and the mask layer are made of the same material.

In the method according to one embodiment of the present invention, the conductive layer is made of doped polysilicon.

In the present invention, the isolation structure and the mask layer having the adequate height are formed first and then the floating gate (conductive layer) are formed by using self-alignment. Accordingly, one step of photolithography process can be saved and the device abnormal connecting caused by the misalignment during the photolithography process can be well prevented as well. Therefore, the cost is decreased and the process window is increased. Furthermore, the manufacturing process can be well controlled and the yield are increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
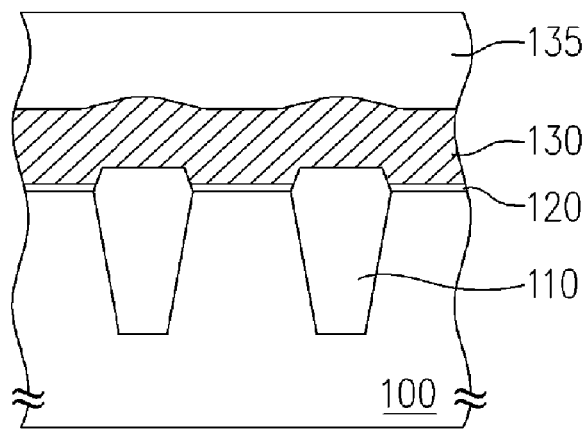
FIGS. 1A through 1C are cross-sectional views schematically illustrating a conventional method for manufacturing a non-volatile memory.
Figure 1B:
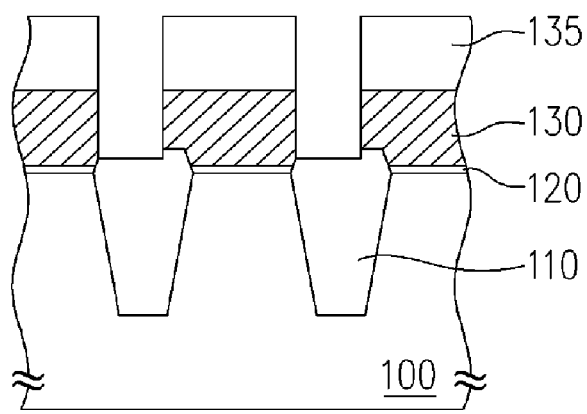
Figure 1C:
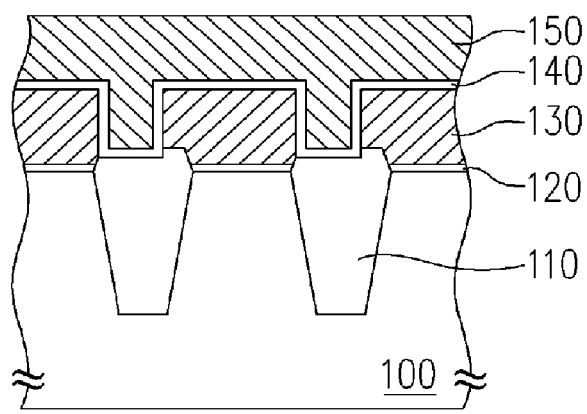
Figure 2A:
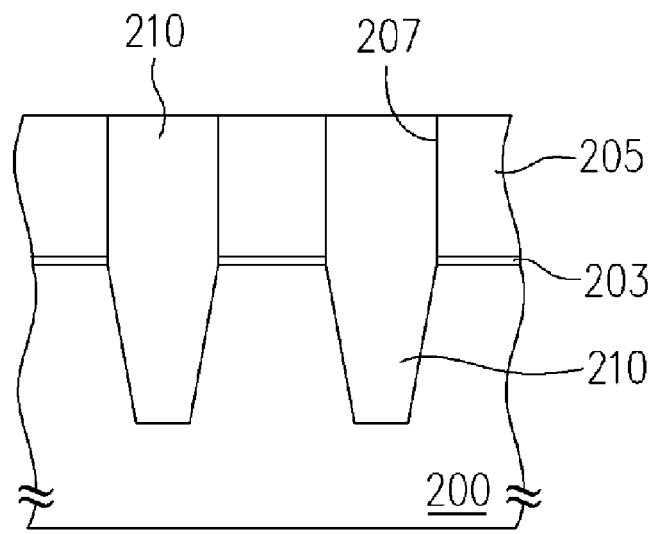
FIGS. 2A through 2E are cross-sectional views schematically showing a method for manufacturing a non-volatile memory according to a preferred embodiment of the invention.

FIGS. 2A through 2E are cross-sectional views schematically showing a method for manufacturing a non-volatile memory according to a preferred embodiment of the invention. In one embodiment, the method for manufacturing a NAND-type flash memory is used to depict the present invention. As shown in FIG. 2A, a substrate 200 is provided. A pad layer 203 and a mask layer 205 are formed on the substrate 200. The substrate 200 can be, for example but not limited to, a silicon substrate. The pad layer 203 can be, for example but not limited to, made from silicon oxide by using the thermal oxidation process. The mask layer 205 can be, for example, made from silicon nitride, silicon carbide or silicon oxy-carbide. In one embodiment, the thickness of the mask layer 205 is about 1300 angstroms.

Then, as shown in FIG. 2A, at least one isolation structure 210 is formed in the mask layer 205, the pad layer 203 and the substrate 200. The method for forming the isolation structure 210 comprises steps of patterning the mask layer 205 and the pad layer 203, then forming a trench 207 in the substrate 200 by using the patterned mask layer 205 as a mask and filling up the trench 207 with an insulating material. The method for patterning the mask layer 205 and the pad layer 203 comprises steps of forming a patterned photoresist layer (not shown) and then removing a portion of the mask layer 205 and the pad layer 203 by using the patterned photoresist layer as a mask. The method for removing the portion of the mask layer 205 and the pad layer 203 exposed by the patterned photoresist layer includes a reactive ion etching process. The insulating material for filling up the trench 207 can be, for example, silicon oxide formed by using the chemical vapor deposition. The insulating material is inevitably covers the mask layer 205 so that the isolating material is planarized to form the isolation structure 210 by using the mask layer 205 as a stop layer. The method for planarizing the isolating material includes the chemical mechanical polishing process.

Figure 2B:
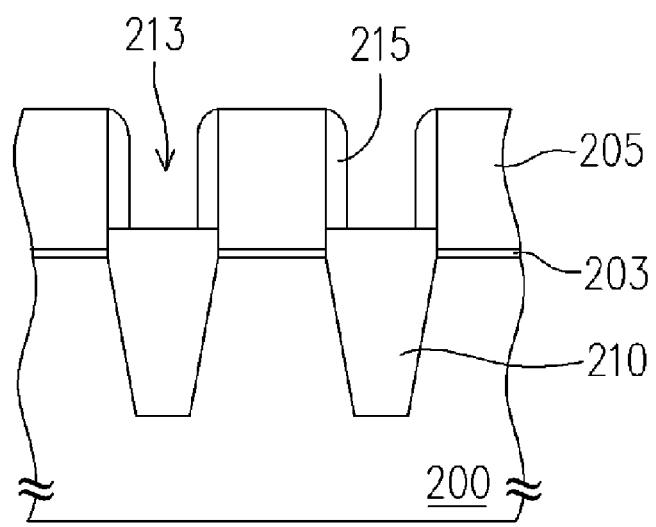

As shown in FIG. 2B, a portion of the isolation structure 210 is removed to form a recession 213 in the mask layer 205. The top surface of the remaining isolation structure 210 and the top surface of the substrate 200 are coplanar. However, the present invention is not limited to the phenomenon mentioned above. The method for removing the portion of the isolation structure 210 includes the dry etching process and the wet etching process with the use of the difference between the etching rates of the isolation structure 210 and the mask layer 205.

As shown in FIG. 2B, a spacer 215 is formed on the sidewall of the recession 213. The spacer 215 can be, for example but not limited to, made of the material, such as silicon nitride, silicon carbide and silicon nitro-carbide, used to form the mask layer 205. The method for forming the spacer 215 comprises steps of forming a conformal spacer material layer (not shown) on the mask layer and then etching back the spacer material layer to remove a portion of the spacer material layer so as to form the spacer on the side wall of the recession 213.

Figure 2C:
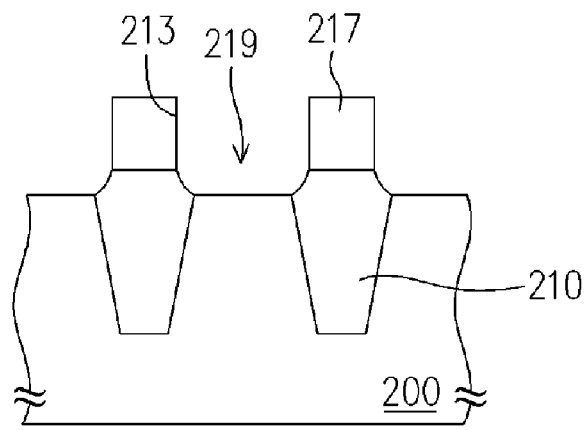

As shown in FIG. 2C, the recession 213 is filled up with an insulating layer 217. The insulating layer 217 can be, for example but not limited to, made of the material, such as silicon oxide, which is used to form the isolation structure 210. The method for forming the insulating layer 217 comprises steps of performing the chemical vapor deposition to form a conformal insulating material layer (not shown) and then performing a planarizing process by using the mask layer 205 as a stop layer. Moreover, the mask layer 205, the pad layer 203 and the spacer 215 are removed to form several openings 219 exposing the substrate 200. The method for removing the mask layer 205, the pad layer 203 and the spacer 215 includes the etching back process. The depth of the opening 219, which is the distance between the bottom surface of the opening 219 and the top surface of the insulating layer 217, is about 1000 angstroms.

Figure 2D:
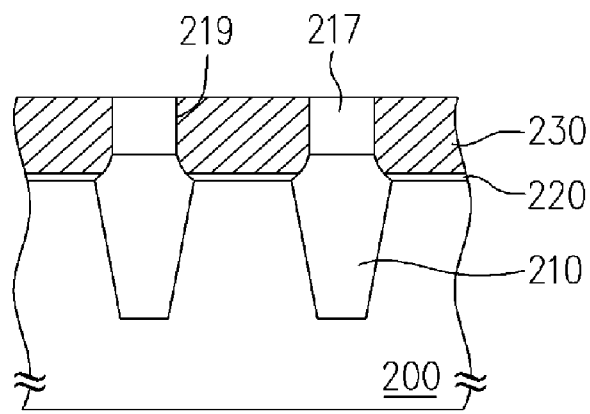

As shown in FIG. 2D, a tunneling dielectric layer 220 is formed on the substrate 200. The tunneling dielectric layer 220 can be, for example but not limited to, made from silicon oxide by the thermal oxidation process or the chemical vapor deposition process. Then, a conductive layer 230 is formed on the tunneling dielectric layer 220 to fill up the openings 219. The conductive layer 230 can be, for example but not limited to, made of doped polysilicon, metal or metal silicide. The method for forming the conductive layer 230 comprises steps of performing the physical vapor deposition process or the chemical vapor deposition to form a conductive material layer (not shown) and then planarizing the conductive material layer by using the insulating layer 217 as a stop layer. In one embodiment, the thickness of the conductive layer 230 is about 800 angstroms.

Figure 2E:
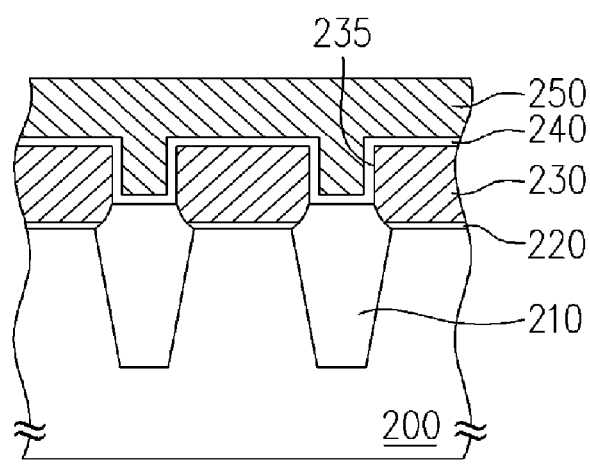

As shown in FIG. 2D and FIG. 2E, a portion of the insulating layer 217 is removed to from openings 235 between the conductive layer 230 filling in the openings 219. The method for removing the portion of the insulating layer 217 includes the dry etching process and the wet etching process. Furthermore, a gate dielectric layer 240 is formed on the substrate 200. The gate dielectric layer 240 can be, for example but not limited to, made of silicon oxide, silicon nitride or complex dielectric layer such as silicon oxide/ silicon nitride/silicon oxide. The method for forming the gate dielectric layer 240 comprises a step of performing the chemical vapor deposition with different reaction gas according to the material of gate dielectric layer 240.

Thereafter, a conductive layer 250 is formed on the gate dielectric layer 240 and fills up the openings 235. The top surface of the conductive layer 250 is higher than the top surface of the conductive layer 230. The conductive layer 250 can be, for example but not limited to, made of doped polysilicon, metal or metal silicide. The method for forming the conductive layer 250 comprises steps of forming a conductive material layer (not shown) by using the physical vapor deposition process or the chemical vapor deposition process and then planarizing the conductive material layer. The method for planarizing the conductive material layer includes the chemical mechanical polishing process. The conductive layer 250 and the conductive layer 230 are patterned to form the strip type conductive layer 250 and the block type conductive layer 230 which are the control gate and the floating gate respectively. The method for patterning conductive layer 250 and the conductive layer 230 comprises steps of forming a pattered photoresist layer (not shown) and then removing a portion of the conductive layer 250 and the conductive layer 230 by using the patterned photoresist layer as a mask. The method for removing the portion of the conductive layer 250 and the conductive layer 230 includes the reactive ion etching process. Then, the processes for forming the source, the drain or word line, bit line are performed sequentially and are not described herein as the processes are well known in the art.

In the present invention, the isolation structure and the mask layer having the adequate height are formed first and then the floating gate (conductive layer) are formed by using self-alignment so that the cost is decreased. Furthermore, the device abnormal connecting caused by the misalignment during the photolithography process can be well prevented so that the process window and the yield are increased.

Additionally, by controlling the thickness of the mask layer and forming the spacer at the sidewall of the recession, the floating gate possesses relatively large thickness and width. Therefore, the area of the capacitor between the floating gate and the control gate is increased so that the gate electrode coupling is increased. Hence, the operating voltage is decreased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a non-volatile memory, comprising:
   providing a substrate;
   forming a mask layer on the substrate;
   forming an isolation structure in the mask layer and the substrate;
   removing a portion of the isolation structure to form at least one recession between the isolation structure;
   forming a spacer at the sidewall of the recession;
   filling up the recession with an isolating layer;
   removing the mask layer and the spacer to form a first opening exposing a portion of the substrate;
   forming a tunneling dielectric layer over the substrate;
   forming a first conductive layer to fill the first opening;
   removing the isolating layer to form a second opening in the first conductive layer;
   forming a gate dielectric layer over the substrate;
   forming a second conductive layer on the gate dielectric layer; and
   patterning the second conductive layer and the first conductive layer.

2. The method of claim 1, wherein the method for forming the first conductive layer to fill the first opening comprises:
   forming a first conductive material layer; and planarizing the first conductive material layer by using the isolating layer as a stop layer.

3. The method of claim 2, wherein the step of planarizing the first conductive material layer further comprises a step of removing a portion of the isolating layer.

4. The method of claim 2, wherein the method of planarizing the first conductive material layer comprises a chemical mechanical polishing.

5. The method of claim 1, wherein the method for removing the mask layer and the spacer comprises a dry etching process and a wet etching process.

6. The method of claim 1, wherein the method of forming the isolation structure comprises:
patterning the mask layer;
forming a trench in the substrate by using the mask layer as a mask; and
filling up the trench with an isolation material so as to form the isolation structure.

7. The method of claim 1, wherein the method for forming a spacer comprises:
forming a spacer material layer over the mask layer, and
etching back the spacer material layer to form the spacer at the sidewall of the mask layer.

8. The method of claim 1, wherein, before the mask layer is formed, further comprising a step of forming a pad layer.

9. The method of claim 1, wherein the gate dielectric layer can be a silicon oxide/silicon nitride/silicon oxide layer.

10. The method of claim 1, wherein the first conductive layer is made of doped polysilicon.

11. The method of claim 1, wherein the second conductive layer is made of doped polysilicon.

12. A method for forming a floating gate layer, comprising:
providing a substrate;
forming a mask layer on the substrate;
forming an isolation structure in the mask layer and the substrate;
removing a portion of the isolation structure so that the top surface of the isolation structure is lower than the top surface of the mask layer and a recession is formed in the mask layer to exposes the sidewall of the mask layer;
forming a spacer on the sidewall of the mask layer;
filling up the recession with an isolating layer;
removing the mask layer and the spacer to form an opening exposing the substrate;
forming a tunneling dielectric layer over the substrate; and
forming a conductive layer over the substrate to fill the opening.

13. The method of claim 12, wherein the method for forming the conductive layer to fill the opening comprises:
forming a conductive material layer; and
planarizing the conductive material layer by using the isolating layer as a stop layer.

14. The method of claim 13, wherein the step of planarizing the conductive material layer farther comprises a step of removing a portion of the isolating layer.

15. The method of claim 13, wherein the method of planarizing the conductive material layer comprises a chemical mechanical polishing.

16. The method of claim 12, wherein the method for removing the mask layer and the spacer comprises a dry etching process and a wet etching process.

17. The method of claim 12, wherein the method of forming the isolation structure comprises:
patterning the mask layer;
forming a trench in the substrate by using the mask layer as a mask; and
filling up the trench with an isolation material so as to Form the isolation structure.

18. The method of claim 12. wherein the method for forming a spacer comprises:
forming a spacer material layer over the mask layer; and
etching back the spacer material layer to form the spacer at the sidewall of the mask layer.

19. The method of claim 12, wherein the spacer and the mask layer are made of the same material.

20. The method of claim 12, wherein the conductive layer is made of doped polysilicon.

* * * * *